United States Patent
Tanaka (10) Patent No.: US 7,522,204 B2
(45) Date of Patent: Apr. 21, 2009

(54) SOLID-STATE IMAGING DEVICE AND ELECTRONIC STILL CAMERA

(75) Inventor: Nagataka Tanaka, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 853 days.

(21) Appl. No.: 10/941,898

(22) Filed: Sep. 16, 2004

(65) Prior Publication Data

US 2005/0104094 A1    May 19, 2005

(30) Foreign Application Priority Data

Sep. 30, 2003    (JP)    ............................. 2003-342569

(51) Int. Cl.
*H04N 3/14* (2006.01)
*H04N 5/335* (2006.01)

(52) U.S. Cl. ...................... 348/308; 348/302
(58) Field of Classification Search ......... 257/213–290; 348/294–310
See application file for complete search history.

(56) References Cited

U.S. PATENT DOCUMENTS

| 6,091,449 | A | 7/2000 | Matsunaga et al. |
| 6,352,869 | B1 | 3/2002 | Guidash |
| 6,674,470 | B1 | 1/2004 | Tanaka et al. |
| 7,002,713 | B2* | 2/2006 | Fukawa ..................... 358/483 |
| 7,151,567 | B2* | 12/2006 | Suzuki et al. ............... 348/296 |

FOREIGN PATENT DOCUMENTS

| JP | 11-97655 | 4/1999 |
| JP | 11-177886 | 7/1999 |
| JP | 11-307752 | 11/1999 |
| JP | 2000-83132 | 3/2000 |
| JP | 2006-506813 | 2/2006 |

\* cited by examiner

*Primary Examiner*—David L Ometz
*Assistant Examiner*—Pritham Prabhakher
(74) *Attorney, Agent, or Firm*—Oblon, Spivak, McClelland, Maier & Neustadt, P.C.

(57) ABSTRACT

A solid-state imaging device has a photodiode provided in a semiconductor substrate of a first conductivity type. A diffusion layer of a second conductivity type is provided in the semiconductor substrate. A gate wiring layer is provided on the semiconductor substrate between the photodiode and the diffusion layer. A gate insulating film is interposed between the semiconductor substrate and the gate wiring layer. A wiring layer is provided on the semiconductor substrate at a position which faces the gate wiring layer across the photodiode. The wiring layer is adjacent to the photodiode.

6 Claims, 11 Drawing Sheets

PRIOR ART

200
SOLID-STATE IMAGING DEVICE AND ELECTRONIC STILL CAMERA

CROSS REFERENCE TO RELATED APPLICATION

This application is based upon and claims the benefit of priority from the prior Japanese Patent Application No. JP2003-342569 filed on Sep. 30, 2004, the entire contents of which are incorporated herein by reference.

FIELD OF THE INVENTION

The present invention relates to a solid state imaging device, and more particularly relates to a solid state imaging device including a photodiode. Furthermore the prevent invention relates to an electronic still camera to which the above-described solid-state imaging device is applied.

DESCRIPTION OF THE BACKGROUND

Video cameras have been miniaturized by the development of semiconductor device technology to become convenient to carry and be widely used. Heretofore, in video cameras, a CCD sensor has been used as a solid-state imaging device. However, the CCD sensor requires a plurality of kinds of voltages for driving the device, and requires a plurality of power source circuits for generating the voltages from a power source voltage. Accordingly, the above-described features of the CCD sensor have inhibited a video camera from being further miniaturized, and has been a factor which inhibits the reduction in power consumption.

Figure 10:
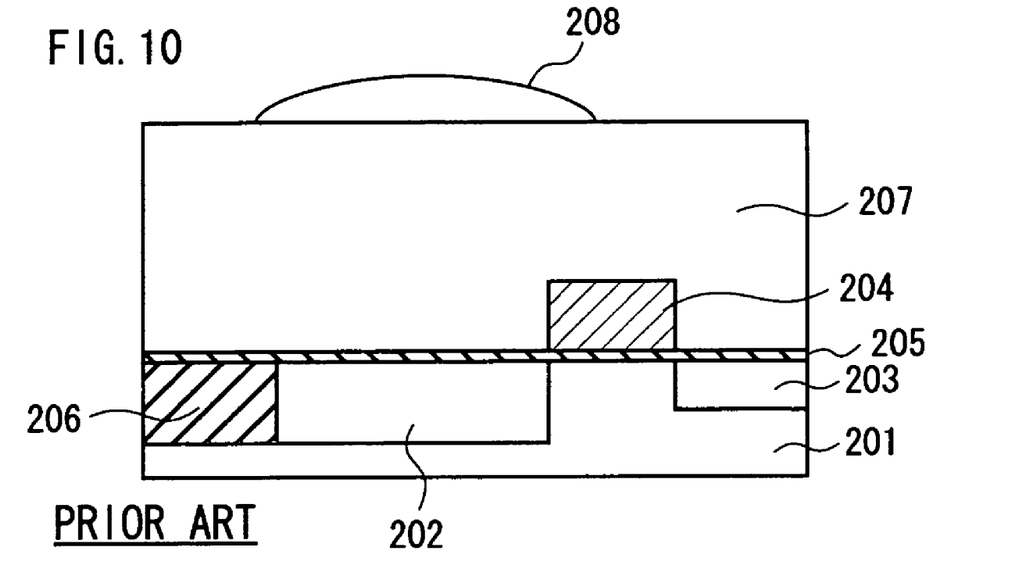
FIG. 10 is a cross-sectional view showing the structure of a unit cell of the conventional solid-state imaging device.

Under the above-described circumstances, a MOS sensor in which an amplifier MOS transistor is used is expected as a solid-state imaging device which replaces a CCD sensor. The MOS sensor can be driven by a single power source. Further, in the MOS sensor, power consumption and voltage can be lowered. A cross-sectional view showing the structure of a unit cell of the conventional solid-state imaging device is shown in FIG. 10.

A photodiode 202 is provided in the upper portion of a silicon substrate 201. Further, in the upper portion of the silicon substrate 201, the drain 203 of a readout transistor is provided to be spaced apart from the photodiode 202. A gate wiring layer 204 is provided between the photodiode 202 and the drain 203 on the silicon substrate 201 with a silicon oxide film 205 interposed therebetween. A silicon oxide film 206 is provided in an element isolation area, whereby an element area is electrically isolated.

An interlayer insulating film 207 is provided over the gate wiring layer 204 and the silicon oxide film 205. A microlens 208 is provided on the interlayer insulating film 207, and focuses light incident on the microlens 208 on the photodiode 202.

Figure 11:
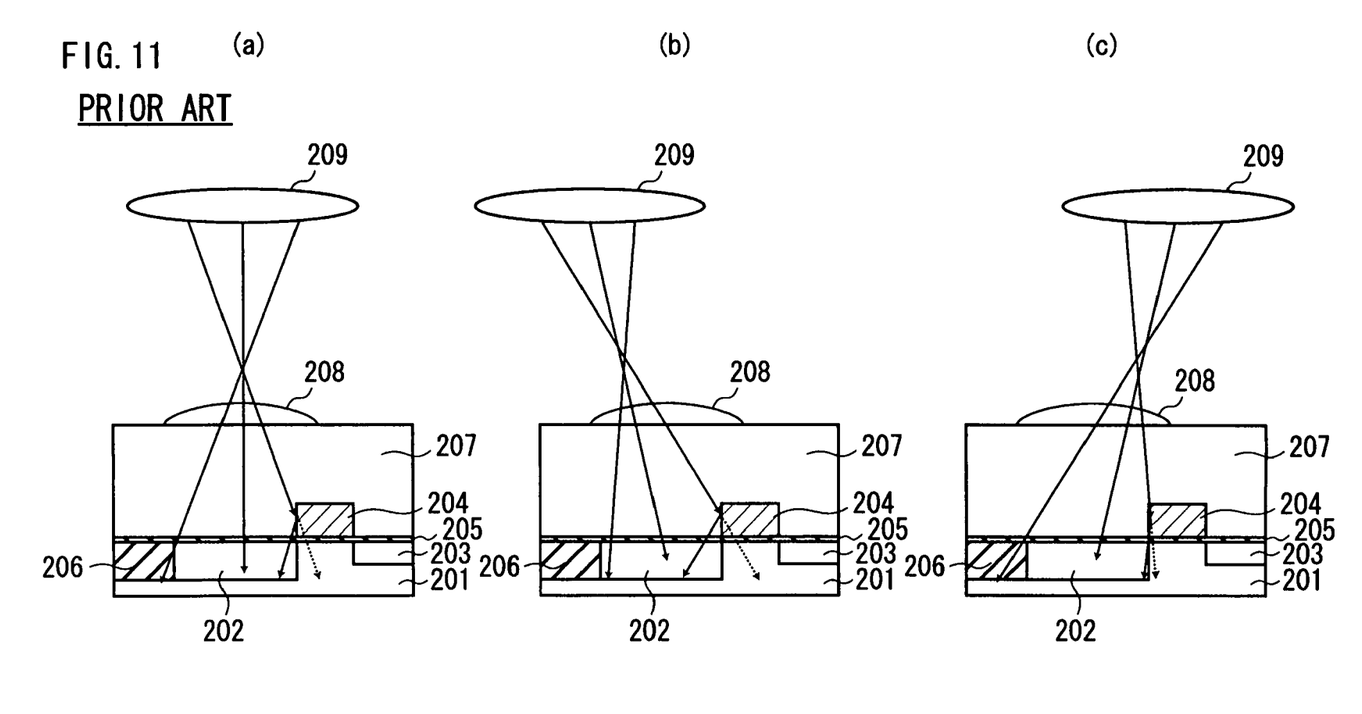
FIG. 11 is a view showing the paths of incident light in a unit cell of the conventional solid-state imaging device.

Next, with reference to FIG. 11(a) to FIG. 11(c), light incident on the photodiode 202 in a unit cell of the conventional solid-state imaging device shown in FIG. 10 will be described. FIG. 11(a) to FIG. 11(c) are views each showing the paths of incident light in a unit cell of the conventional solid-state imaging device. FIG. 11(a) to FIG. 11(c) each show the case where a camera lens 209 is provided over the conventional solid-state imaging device and where light focused by the camera lens 209 is incident on the microlens 208. It is noted that, for convenience of explanation, a description will be made by regarding as the right side the side on which the gate wiring layer 204 is provided, with respect to the photodiode 202, and regarding as the left side the side opposite to the gate wiring layer 204, with respect to the photodiode 202.

FIG. 11(a) shows the case where a unit cell is located directly under the camera lens 209 in an image area and where the optical axis of the microlens 208 and that of the camera lens 209 coincide. Further, FIG. 11(b) shows the case where a unit cell is located on the right side of the optical axis of the camera lens 209 in the image area and where the camera lens 209 is located at the upper left with respect to the microlens 208. Moreover, FIG. 11(c) shows the case where a unit cell is located on the left side of the optical axis of the camera lens 209 in the image area and where the camera lens 209 is located at the upper right with respect to the microlens 208.

First, with reference to FIG. 11(a), light incident on the photodiode 202 in the unit cell located directly under the camera lens 209 will be described. Light passing through the center of the camera lens 209, which is hereinafter referred to as (principal ray), passes through the center of the microlens 208 to be perpendicularly incident on the photodiode 202. On the other hand, light incident on the microlens 208 from the upper right travels in the interlayer insulating film 207 in a direction which deviates from the center of the microlens 208, and is incident on the element isolation area adjacent to the photodiode 202. Moreover, light incident on the microlens 208 from the upper left travels in the interlayer insulating film 207 in a direction which deviates from the center of the microlens 208, and is incident on the gate wiring layer 204. Part of the light incident on the gate wiring layer 204 passes through the gate wiring layer 204 to be incident on the silicon substrate 201 under the gate wiring layer 204. On the other hand, the rest of the light, which does not pass through the gate wiring layer 204, is reflected at the interface between the gate wiring layer 204 and the interlayer insulating film 207, and is incident on the photodiode 202.

Next, with reference to FIG. 11(b), light incident on the photodiode 202 in the unit cell located on the right side of the optical axis of the camera lens 209 will be described. A principal ray travels in an oblique direction from the camera lens 209 located at the upper left to the microlens 208 located at the lower right, and is incident directly on the photodiode 202. On the other hand, light incident from the right side of the camera lens 209 is also incident directly on the photodiode 202, similarly to the principal ray. Further, light incident from the left side of the camera lens 209 is incident on the gate wiring layer 204. Part of the light incident on the gate wiring layer 204 is reflected at the interface between the gate wiring layer 204 and the interlayer insulating film 207, and is incident on the photodiode 202.

Next, with reference to FIG. 11(c), light incident on the photodiode 202 in the unit cell located on the left side of the optical axis of the camera lens 209 will be described. A principal ray travels in an oblique direction from the camera lens 209 located at the upper right to the microlens 208 located at the lower left, and is incident directly on the photodiode 202. On the other hand, light incident from the right side of the camera lens 209 is incident on the element isolation area. Further, light incident from the left side of the camera lens 209 is incident on the gate wiring layer 204. Part of the light incident on the gate wiring layer 204 is reflected at the interface between the gate wiring layer 204 and the interlayer insulating film 207, and is incident on the photodiode 202.

In the conventional solid-state imaging device, as shown in FIG. 11(b), light incident from the right side of the camera lens 209 is incident directly on the photodiode 202 in the unit cell located on the right side of the optical axis of the camera lens 209. On the other hand, in the unit cell located on the left side of the optical axis of the camera lens 209, as shown in FIG. 11(c), light incident from the right side of the camera lens 209 is incident on the element isolation area. Although the light incident on the element isolation area passes through the silicon oxide film 206 to undergo photoelectric conversion in the silicon substrate 201, much of the signal charge recombines in the vicinity of the silicon oxide film 206 and, therefore, is not accumulated in the photodiode 202. Accordingly, in the conventional solid-state imaging device, the unit cell located on the right side of the optical axis of the camera lens 209 has a higher sensitivity to incident light from the right side of the camera lens 209 than the unit cell located on the left side of the optical axis of the camera lens 209.

On the other hand, for light incident from the left side of the camera lens 209, the quantity of light incident on the photodiode 202 is approximately the same whether the unit cell is located on the left or right of the image area, because the light incident from the left side of the camera lens 209 is reflected by the gate wiring layer 204 as shown in FIG. 11(b) and FIG. 11(c).

Consequently, in the conventional solid-state imaging device, a unit cell located on the right side of the optical axis of the camera lens 209 has a higher sensitivity to incident light than a unit cell located on the left side of the optical axis of the camera lens 209.

The sensitivity of a unit cell is reflected as the brightness of a pixel in a captured image. Accordingly, if the sensitivities of unit cells differ depending on the positions of the unit cells in the image area, one edge is brighter but the other edge is darker in a captured image. For this reason, it is being demanded that variations in the sensitivities of the unit cells within the image area with respect to the positions of the unit cells are suppressed.

SUMMARY OF THE INVENTION

Accordingly, an object of the present invention is to provide a solid-state imaging device in which variations in the sensitivities of unit cells within an image area with respect to the positions of the unit cells are suppressed.

Moreover, another object of the present invention is to provide an electronic still camera to which the above-described solid-state imaging device is applied.

To that end, according to one aspect of the present invention there is provided a solid-state imaging device including a semiconductor substrate of a first conductivity type, a photodiode provided in the semiconductor substrate, a diffusion layer of a second conductivity type provided in the semiconductor substrate, the diffusion layer being spaced away from the photodiode, a gate wiring layer provided on the semiconductor substrate between the photodiode and the diffusion layer and a wiring layer provided on the semiconductor substrate at a position which faces the gate wiring layer across the photodiode, the wiring layer being adjacent to the photodiode.

DETAILED DESCRIPTION OF THE INVENTION

Hereinafter, an embodiment of a solid-state imaging device according to the present invention will be described with reference to FIG. 1 to FIG. 7.

Figure 1:
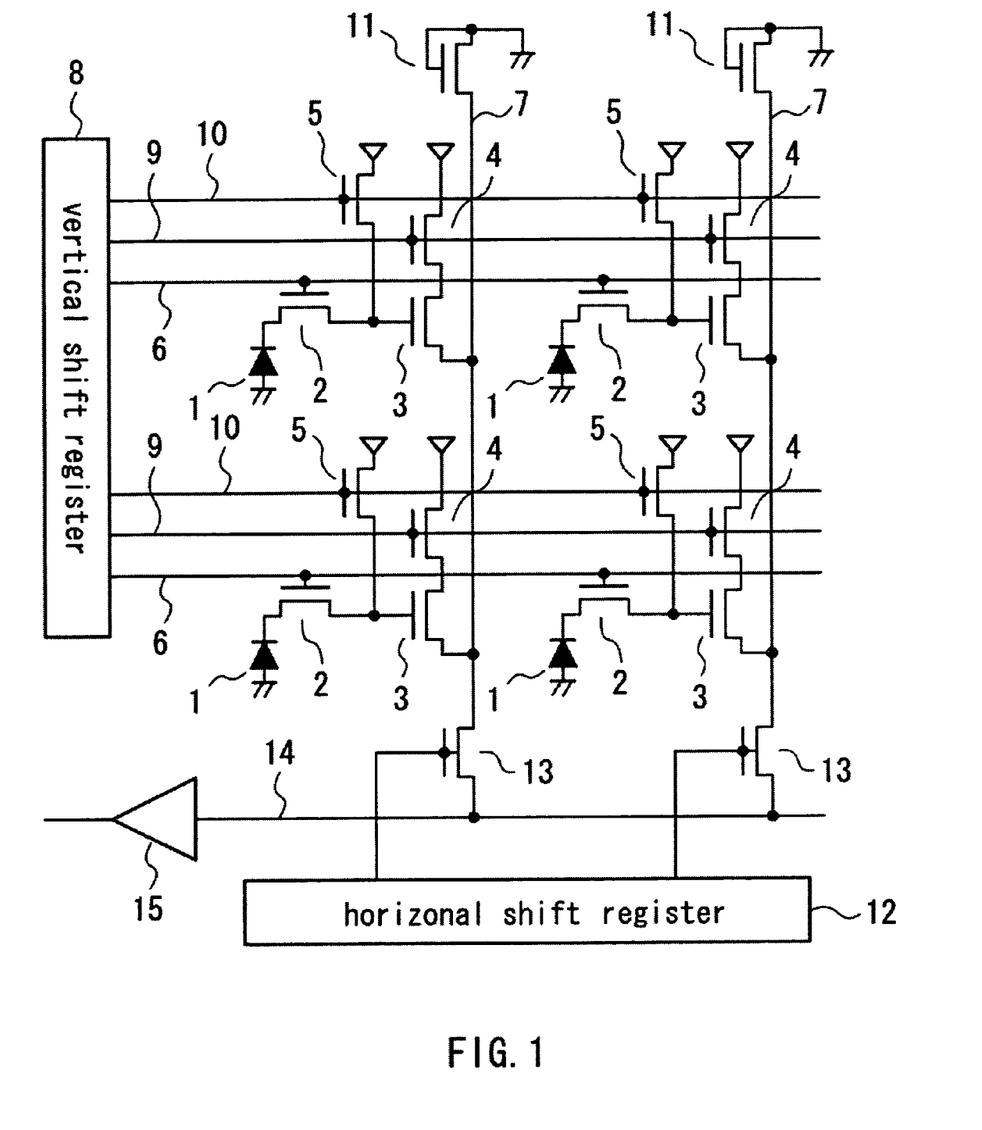
FIG. 1 is a circuit diagram showing the circuit configuration of the solid-state imaging device according to the present embodiment.

First, the circuit configuration of the solid-state imaging device according to the present embodiment will be described with reference to FIG. 1. FIG. 1 is a circuit diagram showing the circuit configuration of the solid-state imaging device according to the present embodiment.

Unit cells are two-dimensionally arranged in a 2?2 matrix. The plurality of unit cells two-dimensionally arranged constitute an image area. It is noted that a larger number of unit cells are arranged in an actual case. A unit cell includes a photodiode 1, a readout transistor 2, an amplifier transistor 3, an address transistor 4, and a reset transistor 5. The photodiode 1 performs photoelectric conversion on incident light and accumulates a signal charge. The readout transistor 2 reads the signal charge accumulated by the photodiode 1 into the gate of the amplifier transistor 3 by a readout line 6 going to a high level. The amplifier transistor 3 and a load transistor 11 function as a source follower circuit, and output a voltage according to the gate voltage of the amplifier transistor 3 to a vertical signal line 7. The reset transistor 5 resets the signal charge accumulated in the gate of the amplifier transistor 3 to a predetermined voltage.

Horizontal address lines 9, which are horizontally wired from a vertical shift register 8, are connected to the gates of the address transistors 4 to determine which row is operated as a source follower circuit. Each reset line 10 is connected to the gates of reset transistors 5. A load transistor 11 is provided at one end of each vertical signal line 7. Further, the other end of each vertical signal line 7 is connected to a horizontal signal line 14 through a selection transistor 13. The selection transistor 13 is selected by a selection pulse supplied from a horizontal shift register 12. A signal read into the horizontal signal line 14 is amplified by an amplifier 15 to be outputted.

Figure 2:
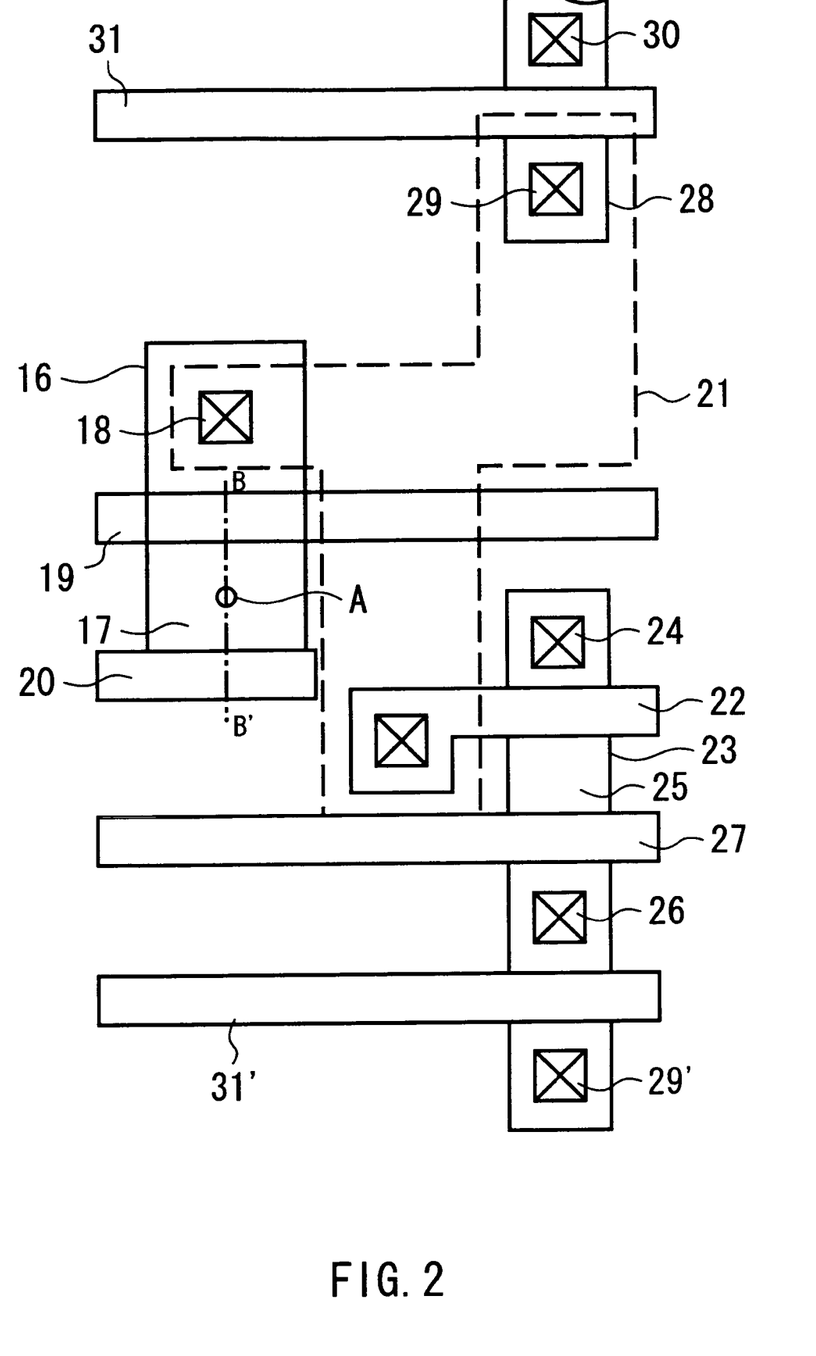
FIG. 2 is a plan view showing the structure of a unit cell of the solid-state imaging device according to the present embodiment.

Next, with reference to FIG. 2, the structure of a unit cell of the solid-state imaging device according to the present embodiment will be described. FIG. 2 is a plan view showing the structure of a unit cell of the solid-state imaging device according to the present embodiment.

A photodiode 17 and the drain 18 of a readout transistor 2 are formed in an element area 16 of a semiconductor substrate to be spaced apart. Further, the gate wiring layer 19 of the readout transistor 2 is provided between the photodiode 17 and the drain 18. This gate wiring layer 19 is connected to a readout line 6 (not shown).

At a position facing the gate wiring layer 19 across the photodiode 17, a wiring layer 20 is provided. This wiring layer 20 is connected to a reset line 10 (not shown). Moreover, the side surface of the gate wiring layer 19 which is adjacent to the photodiode 17, and the side surface of the wiring layer 20 which is adjacent to the photodiode 17, are provided such that, at positions which face each other across the photodiode 17 and which are at the same height from the top surface of the semiconductor substrate, the respective distances thereof from the optical axis A of a microlens formed over the photodiode 17 are equal to each other.

The drain 18 of the readout transistor 2 is connected to the gate wiring layer 22 of an amplifier transistor 3 through a jump wiring layer 21. In an element area 23, the source 24 and the drain 25 of the amplifier transistor 3 are formed with the gate wiring layer 22 interposed therebetween. This drain 25 is shared by the amplifier transistor 3 and an address transistor 4, and serves as both the drain of the amplifier transistor 3 and the source of the address transistor 4. The drain 26 of the address transistor 4 is formed to face the drain 25 (source of the address transistor 4) of the amplifier transistor 3 across the gate wiring layer 27. Further, the source 24 of the amplifier transistor 3 is connected to a vertical signal line 7 (not shown) through a contact.

The drain 18 of the readout transistor 2 and the gate wiring layer 22 of the amplifier transistor 3 are connected to the source 29 of a reset transistor 5, which is formed in an element area 28, through the jump wiring layer 21. Moreover, in the element area 28, the drain 30 of the reset transistor 5 is formed to be spaced apart from the source 29. Furthermore, a gate wiring layer 31 is provided between the source 29 and the drain 30. It is noted that a source 29' and a gate wiring layer 31' are the source and the gate wiring layer of a reset transistor 5 of an adjacent unit cell.

Figure 3:
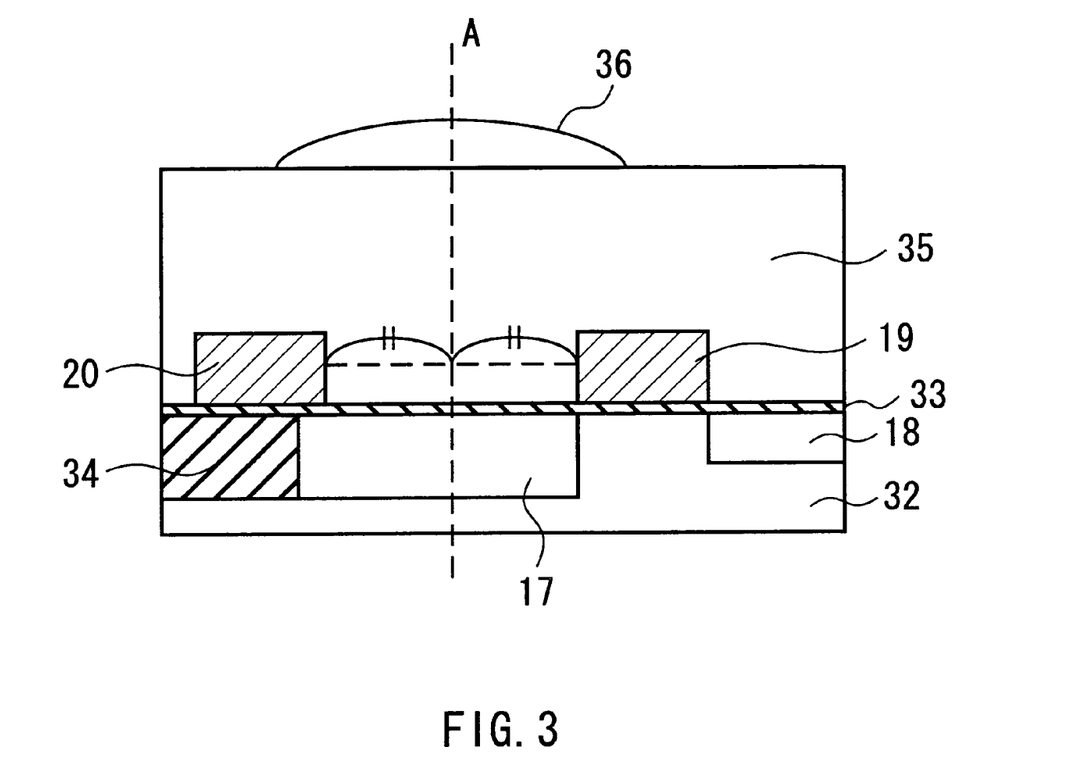
FIG. 3 is a cross-sectional view showing the structure of a unit cell of the solid-state imaging device according to the present embodiment.

Next, with reference to FIG. 3, a cross-sectional structure of a unit cell of the solid-state imaging device according to the present embodiment will be described. FIG. 3 is a cross-sectional view taken along line B-B' in FIG. 2. It is noted that the same components as those in FIG. 2 are denoted by the same reference numerals as those in FIG. 2. It is noted that a description will be made taking a silicon substrate as an example of the semiconductor substrate here.

A photodiode 17 is provided in the upper portion of the silicon substrate 32. Further, the drain 18 of a readout transistor 2 is provided in the upper portion of the silicon substrate 32 to be spaced apart from the photodiode 17. A gate wiring layer 19 is provided between the photodiode 17 and the drain 18 on the silicon substrate 32 with a silicon oxide film 33 (gate insulating film) interposed therebetween. Moreover, at a position which faces the gate wiring layer 19 across the photodiode 17, a wiring layer 20 is provided on the silicon substrate 32 with the silicon oxide film 33 interposed therebetween. A silicon oxide film 34 is provided in an element isolation area (area surrounding an element area 16), whereby the element area 16 is electrically isolated.

An interlayer insulating film 35 is provided over the silicon oxide film 33, the gate wiring layer 19, and the wiring layer 20. A microlens 36 is provided on the interlayer insulating film 35, and focuses light incident on the microlens 36, on the photodiode 17. Moreover, the side surface of the gate wiring layer 19 which is adjacent to the photodiode 17, and the side surface of the wiring layer 20 which is adjacent to the photodiode 17, are provided such that, at positions which face each other across the photodiode 17 and which are at the same height from the top surface of the silicon substrate 32, the respective distances thereof from the optical axis A of the microlens 36 are equal to each other. Furthermore, the gate wiring layer 19 and the wiring layer 20 are formed of the same material, and have same film thickness. The interlayer insulating film 35 is formed of a material having a refractive index different from those of the gate wiring layer 19 and the wiring layer 20.

Figure 4:
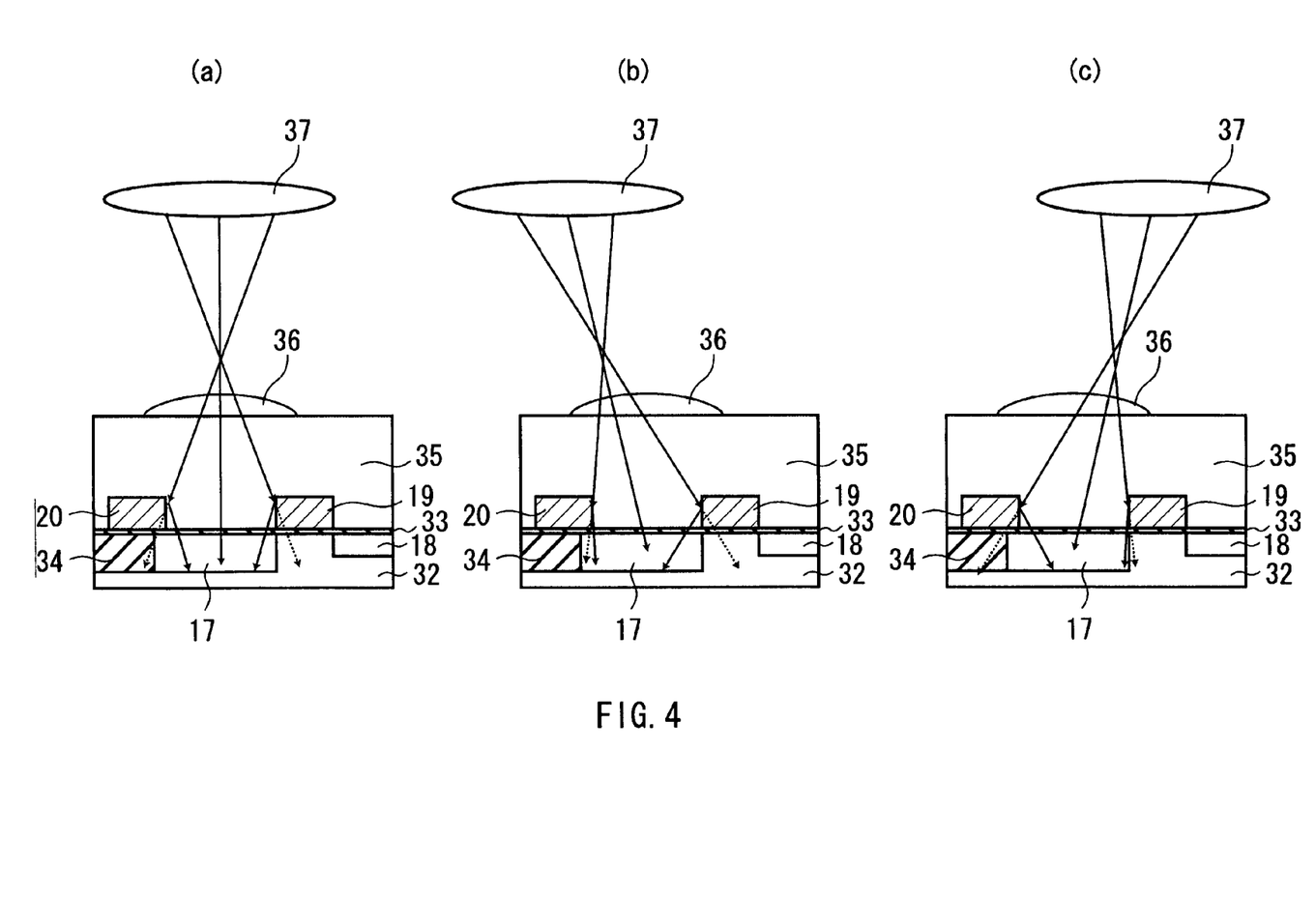
FIG. 4 is a view showing the paths of incident light in the unit cell of the solid-state imaging device according to the present embodiment.

Next, with reference to FIG. 4(*a*) to FIG. 4(*c*), light incident on the photodiode 17 in the unit cell, shown in FIG. 3, of the solid-state imaging device according to the present embodiment, will be described. FIG. 4(*a*) to FIG. 4(*c*) are views showing the paths of incident light in the unit cell of the solid-state imaging device according to the present embodiment. FIG. 4(*a*) to FIG. 4(*c*) each shows the case where a camera lens 37 is provided over the solid-state imaging device according to the present embodiment, and where light focused by the camera lens 37 is incident on the microlens 36. It is noted that, for convenience of explanation, a description will be made by regarding as the right side the side on which the gate wiring layer 19 is provided, with respect to the photodiode 17, and regarding as the left side the side on which the wiring layer 20 is provided, with respect to the photodiode 17.

The path of light incident on the microlens 36 depends on the positional relationship between the unit cell and the camera lens 37. That is, the path of light incident on the microlens 36 differs depending on the position of the unit cell in the image area. FIG. 4(*a*) shows the case where a unit cell is located directly under the camera lens 37 and where the optical axis of the microlens 36 and that of the camera lens 37 coincide. Further, FIG. 4(*b*) shows the case where a unit cell is located on the right side of the optical axis of the camera lens 37 in the image area and where the camera lens 37 is located at the upper left with respect to the microlens 36. Moreover, FIG. 4(*c*) shows the case where a unit cell is located on the left side of the optical axis of the camera lens 37 in the image area and where the camera lens 37 is located at the upper right with respect to the microlens 36. It is noted that the unit cell shown in FIG. 4(*b*) and that shown in FIG. 4(*c*) are unit cells symmetrically located with respect to the unit cell shown in FIG. 4(*a*).

First, with reference to FIG. 4(*a*), light incident on the photodiode 17 in the unit cell located directly under the camera lens 37 will be described. Light passing through the center of the camera lens 37, which is hereinafter referred to as (principal ray), passes through the center of the microlens 36 to be perpendicularly incident on the photodiode 17. On the other hand, light incident on the microlens 36 from the upper right travels in the interlayer insulating film 35 in a direction which deviates from the center of the microlens 36, and is incident on the wiring layer 20 provided on the element isolation area adjacent to the photodiode 17. Part of the light incident on the wiring layer 20 passes through the wiring layer 20 to be incident on the silicon oxide film 34 under the wiring layer 20. On the other hand, the rest of the light, which does not pass through the wiring layer 20, is reflected at the interface between the wiring layer 20 and the interlayer insulating film 35 because the refractive index of the wiring layer 20 and that of the interlayer insulating film 35 are different from each other, and is incident on the photodiode 17. Moreover, light incident on the microlens 26 from the upper left travels in the interlayer insulating film 35 in a direction which deviates from the center of the microlens 36, and is incident on the gate wiring layer 19. Part of the light incident on the gate wiring layer 19 passes through the gate wiring layer 19 to be incident on the silicon substrate 32 under the gate wiring layer 19. On the other hand, the rest of the light, which does not pass through the gate wiring layer 19, is reflected at the interface between the gate wiring layer 19 and the interlayer insulating film 35 because the refractive index of the gate wiring layer 19 and that of the interlayer insulating film 35 are different from each other, and is incident on the photodiode 17.

Next, with reference to FIG. 4(*b*), light incident on the photodiode 17 in the unit cell located on the right side of the optical axis of the camera lens 37 will be described. A principal ray travels in an oblique direction from the camera lens 37 located at the upper left to the microlens 36 located at the lower right, and is incident directly on the photodiode 17. On the other hand, light incident from the right side of the camera lens 37 is incident on the wiring layer 20. Part of the light incident on the wiring layer 20 is reflected at the interface between the wiring layer 20 and the interlayer insulating film 35, and is incident on the photodiode 17. Further, light incident from the left side of the camera lens 37 is incident on the gate wiring layer 19. Part of the light incident on the gate wiring layer 19 is reflected at the interface between the gate wiring layer 19 and the interlayer insulating film 35, and is incident on the photodiode 17.

Next, with reference to FIG. 4(*c*), light incident on the photodiode 17 in the unit cell located on the left side of the optical axis of the camera lens 37 will be described. A principal ray travels in an oblique direction from the camera lens 37 located at the upper right to the microlens 36 located at the lower left, and is incident directly on the photodiode 17. On the other hand, light incident from the right side of the camera lens 37 is incident on the wiring layer 20. Part of the light incident on the wiring layer 20 is reflected at the interface between the wiring layer 20 and the interlayer insulating film 35, and is incident on the photodiode 17. Further, light incident from the left side of the camera lens 37 is incident on the gate wiring layer 19. Part of the light incident on the gate wiring layer 19 is reflected at the interface between the gate wiring layer 19 and the interlayer insulating film 35, and is incident on the photodiode 17.

In the unit cell shown in FIG. 2 and FIG. 3, the gate wiring layer 19 and the wiring layer 20 are provided at positions which face each other across the photodiode 17. Accordingly, light reflected by the gate wiring layer 19 in the unit cell (unit cell located on the right side of the optical axis of the camera lens 37) shown in FIG. 4(*b*), and light reflected by the wiring layer 20 in the unit cell (unit cell located on the left side of the optical axis of the camera lens 37) shown in FIG. 4(*c*), have approximately the same light quantities. Further, light reflected by the wiring layer 20 in the unit cell shown in FIG. 4(*b*), and light reflected by the gate wiring layer 19 in the unit cell shown in FIG. 4(*c*), have approximately the same light quantities. Accordingly, the unit cell shown in FIG. 4(*b*) and that shown in FIG. 4(*c*) have approximately the same sensitivities. That is, unit cells symmetrically located with respect to the optical axis of the camera lens 37 in the direction in which the gate wiring layer 19 and the wiring layer 20 face each other, have approximately the same sensitivities. It is noted that, in order to equalize the quantity of light reflected by the gate wiring layer 19 and that of light reflected by the wiring layer 20, the following is preferable: the side surface of the gate wiring layer 19 which is adjacent to the photodiode 17, and the side surface of the wiring layer 20 which is adjacent to the photodiode 17, are provided as illustrated in FIG. 2 and FIG. 3 such that, at positions which face each other across the photodiode 17 and which are at the same height from the top surface of the semiconductor substrate, the respective distances thereof from the optical axis A of the microlens 36 formed over the photodiode 17 are equal to each other.

Figure 5:
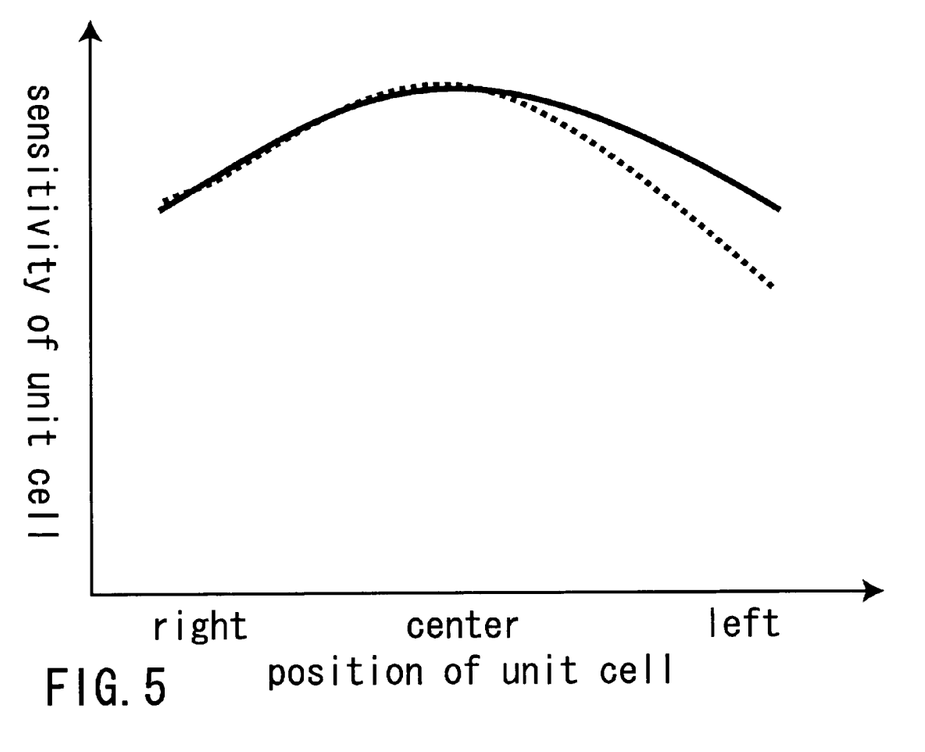
FIG. 5 is an illustration showing sensitivities of unit cells of the solid-state imaging device according to the present embodiment.

The sensitivities of unit cells of the solid-state imaging device according to the present embodiment are shown in FIG. 5. The horizontal axis represents the position of the unit cell relative to the center of the image area, and the vertical axis represents the sensitivity of the unit cell. Further, the sensitivities of the unit cells of the solid-state imaging device according to the present embodiment are represented by a solid line, and the sensitivities of unit cells of the conventional solid-state imaging device shown in FIG. 10 are represented by a dotted line.

In the unit cell, shown in FIG. 2 and FIG. 3, of the solid-state imaging device according to the present embodiment, the wiring layer 20 is provided at a position which faces the gate wiring layer 19 of the readout transistor 2 across the photodiode 17. The provision of the wiring layer 20 causes light incident on the element isolation area in the unit cell of the conventional solid-state imaging device shown in FIG. 10 to be reflected at the interface between the wiring layer 20 and the interlayer insulating film 35 and to be incident on the photodiode 17. The quantity of light reflected by the wiring layer 20 is large in the case where the unit cell is located on the left side of the center of the image area as shown in FIG. 4(*c*). Accordingly, in the solid-state imaging device according to the present embodiment, the sensitivities of unit cells located on the left side of the image area are improved compared to those of the conventional solid-state imaging device shown in FIG. 10.

In the above-described solid-state imaging device according to the present embodiment, the wiring layer 20 is provided at a position which faces the gate wiring layer 19 of the readout transistor 2 across the photodiode 17, to be adjacent to the photodiode 17. Accordingly, in the solid-state imaging device according to the present embodiment, unit cells symmetrically located with respect to the optical axis of the camera lens 37 in the direction in which the gate wiring layer 19 and the wiring layer 20 face each other can have approximately the same sensitivities, and variations in the sensitivities of unit cells within the image area with respect to the positions of the unit cells can be suppressed.

Further, in the solid-state imaging device according to the present embodiment, light incident on the element isolation area from an oblique direction is reflected by the wiring layer 20 to be made incident on the photodiode 17. Accordingly, in the solid-state imaging device according to the present embodiment, the sensitivities of the unit cells to incident light from oblique directions are improved compared to those of conventional solid-state imaging devices.

Moreover, in the solid-state imaging device according to the present embodiment, the wiring layer 20 is formed of the same material as that of the gate wiring layer 19 of the readout transistor 2, in the same layer as that of the gate wiring layer 19 of the readout transistor 2. Accordingly, by simultaneously forming the wiring layer 20 in the step of forming the gate wiring layer 19, the solid-state imaging device according to the present embodiment can be manufactured without increase in the number of steps compared to the case where the conventional solid-state imaging device shown in FIG. 10 is manufactured.

Furthermore, as shown in FIG. 5, the sensitivities of the unit cells of the solid-state imaging device according to the present embodiment have parabolic characteristics having a vertex at the position directly under the camera lens 37, with respect to the positions of the unit cells in the image area. Accordingly, shading compensation can be effectively performed on a captured image obtained by the solid-state imaging device according to the present embodiment. The shading compensation will be described in detail later.

Figure 6:
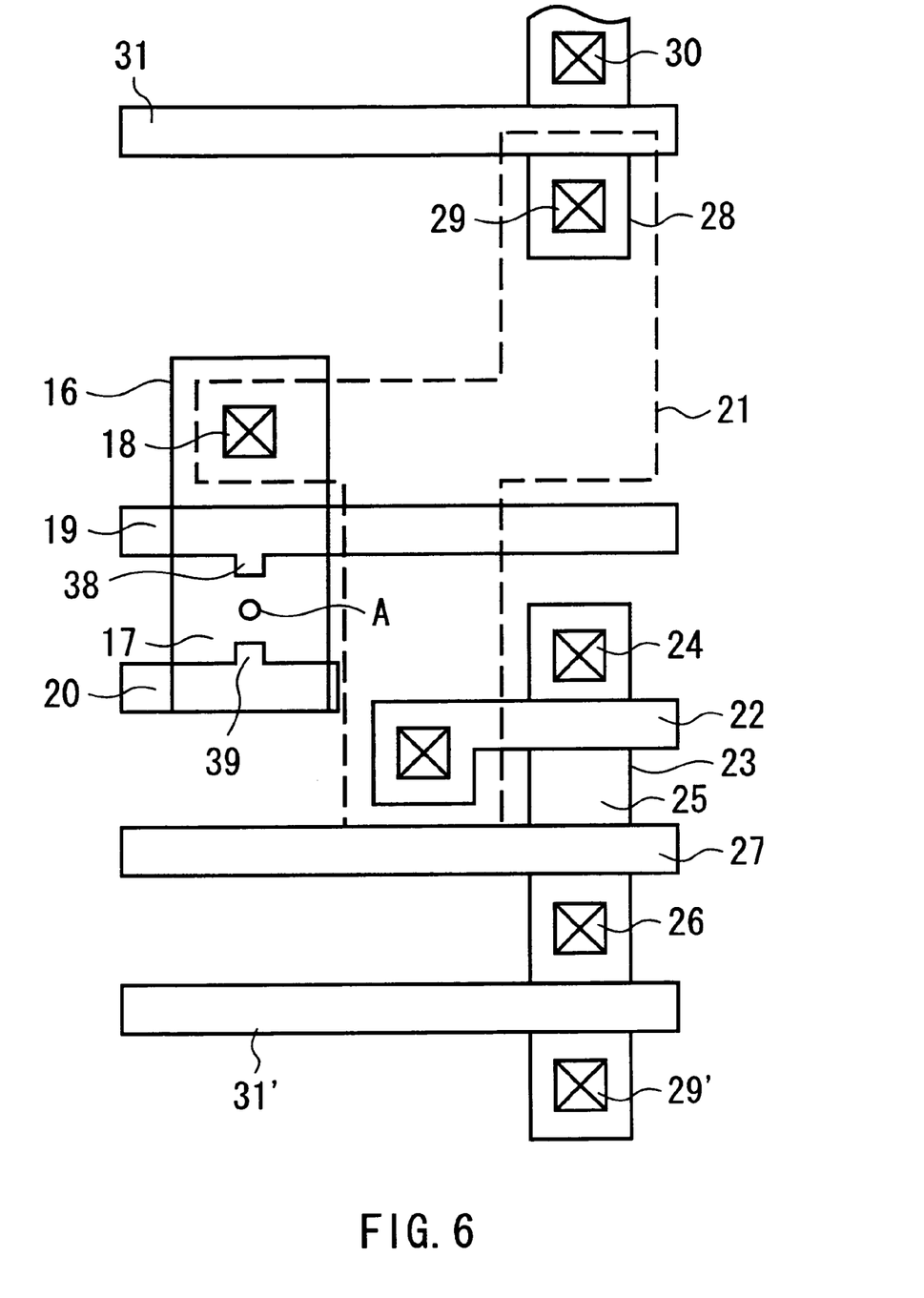
FIG. 6 is a plan view showing the structure of a unit cell of the solid-state imaging device according to the first modification of the present embodiment.

Next, with reference to FIG. 6, a solid-state imaging device according to a first modification of the present embodiment will be described. FIG. 6 is a plan view showing the structure of a unit cell of the solid-state imaging device according to the first modification of the present embodiment. It is noted that, in FIG. 6, the same components as those described with reference to FIG. 2 are denoted by the same reference numerals as those in FIG. 2 and will not be further described.

A gate wiring layer 19 is provided between a photodiode 17 and a drain 18. In the gate wiring layer 19, a protruding portion 38 is provided to cover a part of the photodiode 17. Further, a wiring layer 20 is provided at a position which faces the gate wiring layer 19 across the photodiode 17. In the wiring layer 20, a protruding portion 39 is provided to cover a part of the photodiode 17. Moreover, the side surface of the gate wiring layer 19 which is adjacent to the photodiode 17, and the side surface of the wiring layer 20 which is adjacent to the photodiode 17, are provided such that, at positions which face each other across the photodiode 17 and which are at the same height from the top surface of a semiconductor substrate, the respective distances thereof from the optical axis A of a microlens formed over the photodiode 17 are equal to each other.

Also in the above-described solid-state imaging device according to the first modification of the present embodiment, effects similar to those of the solid-state imaging device according to the present embodiment can be obtained. Thus, in the solid-state imaging device according to the present embodiment, the shapes of the gate wiring layer 19 and the wiring layer 20 are not limited to those shown in FIG. 2 and FIG. 3.

Figure 7:
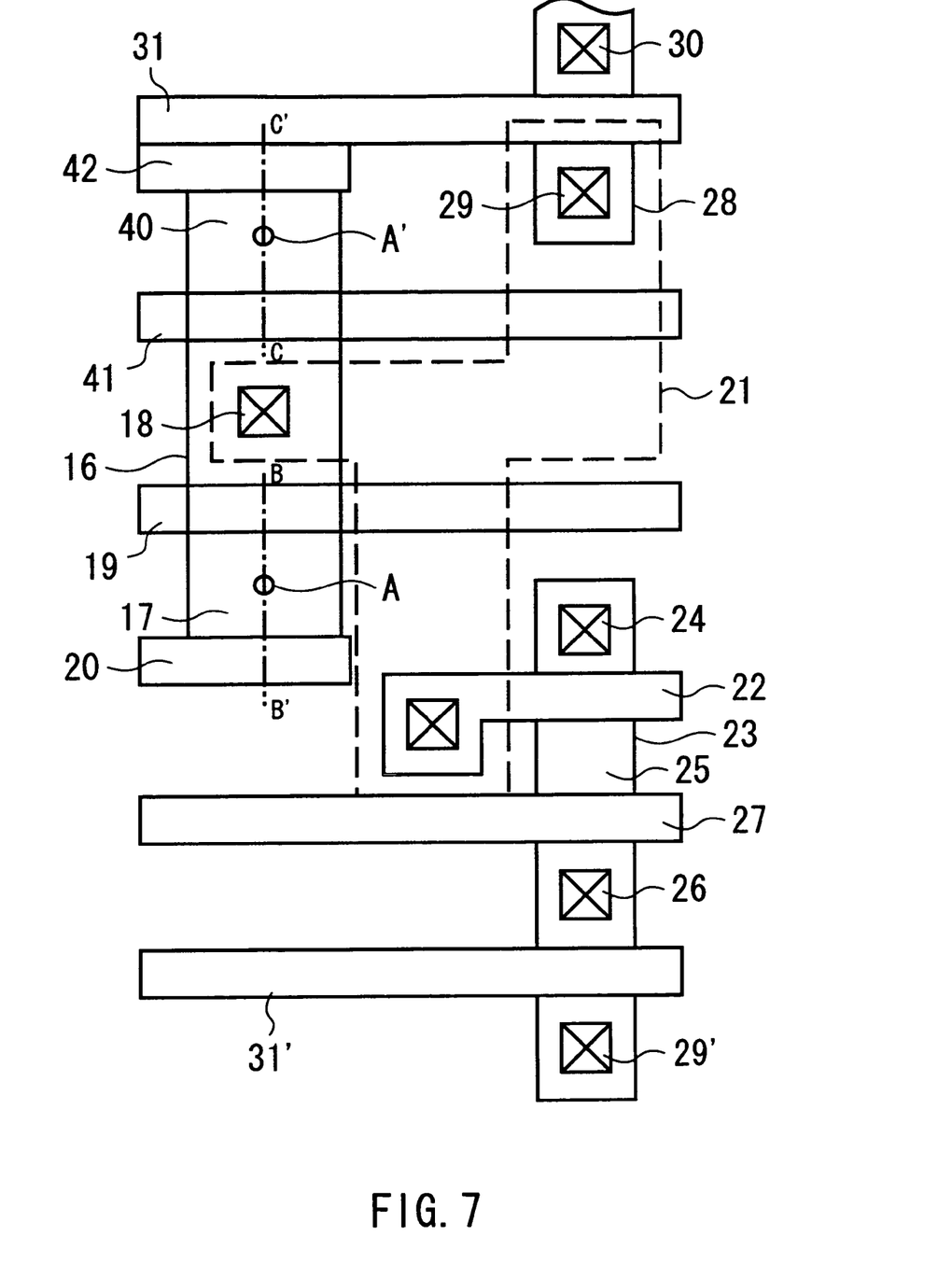
FIG. 7 is a plan view showing the structure of a solid-state imaging device according to a second modification of the present embodiment.

Next, with reference to FIG. 7, a solid-state imaging device according to a second modification of the present embodiment will be described. FIG. 7 is a plan view showing the structure of a unit cell of the solid-state imaging device according to the second modification of the present embodiment. It is noted that, in FIG. 7, the same components as those described with reference to FIG. 2 are denoted by the same reference numerals as those in FIG. 2 and will not be further described.

In an element area 16 of a semiconductor substrate, a photodiode 40 (second photodiode) is provided at a position facing a photodiode 17 (first photodiode) across a drain 18, to be spaced apart from the drain 18. A gate wiring layer 41 (second gate wiring layer) is provided between the drain 18 and the photodiode 40. The gate wiring layer 41 is connected to a readout line 6 (not shown).

A wiring layer 42 (second wiring layer) is provided at a position which faces the gate wiring layer 41 across the photodiode 40. The wiring layer 42 is connected to a reset line 10 (not shown). Further, the side surface of the gate wiring layer 41 which is adjacent to the photodiode 40, and the side surface of the wiring layer 42 which is adjacent to the photodiode 40, are provided such that, at positions which face each other across the photodiode 40 and which are at the same height from the top surface of the semiconductor substrate, the respective distances thereof from the optical axis A of a microlens (second microlens) formed over the photodiode 40 are equal to each other. It is noted that the cross-sectional structure taken along line C-C' in FIG. 7 is approximately the same as that taken along line B-B' shown in FIG. 3.

As described above, in the solid-state imaging device according to the second modification of the present embodiment, two photodiodes 17 and 40 are formed at positions facing each other across the drain 18, and two readout transistors share the drain 18, whereby an amplifier transistor, an address transistor, and a reset transistor are shared.

Here, suppose that the wiring layers 20 and 42 are not provided in the solid-state imaging device, shown in FIG. 7, according to the second modification of the present embodiment. If the drain 18 is shared by the two readout transistors, two gate wiring layers 19 and 41 are provided to face each other across the drain 18. That is, in the two readout transistors, the positions at which the gate wiring layers are provided are opposite in relation to the photodiodes. Accordingly, since the gate wiring layer 19 reflects incident light, the photodiode 17 has a higher sensitivity in the case where light is incident in an oblique direction from the lower side (opposite side of the gate wiring layer 19 with respect to the photodiode 17) of FIG. 7 than in the case where light is incident in an oblique direction from the upper side (side on which the gate wiring layer 19 is provided, with respect to the photodiode 17) of FIG. 7. On the other hand, since the gate wiring layer 41 reflects incident light, the photodiode 40 has a higher sensitivity in the case where light is incident in an oblique direction from the upper side (opposite side of the gate wiring layer 41 with respect to the photodiode 40) of FIG. 7 than in the case where light is incident in an oblique direction from the lower side (side on which the gate wiring layer 41 is provided, with respect to the photodiode 40) of FIG. 7. As described above, if the two readout transistors share the drain 18, the two photodiodes 17 and 40 within the same unit cell have different sensitivities to incident light from an oblique direction. If the sensitivities of adjacent photodiodes are different, a captured image in which the brightnesses of adjacent pixels are different is obtained irrespective of a subject.

However, in the solid-state imaging device according to the second modification of the present embodiment, the wiring layer 20 is provided at a position facing the gate wiring layer 19 across the photodiode 17, and the wiring layer 42 is provided at a position facing the gate wiring layer 41 across the photodiode 40. Accordingly, in the solid-state imaging device according to the second modification of the present embodiment, adjacent photodiodes have the same sensitivity, and adjacent pixels of a captured image can have brightnesses corresponding to the light quantities from a subject.

Further, in the solid-state imaging device according to the second modification of the present embodiment, effects similar to other effects of the solid-state imaging device according to the present embodiment can be obtained.

It is noted that, in the present embodiment, a description has been made by taking a silicon substrate as an example of the semiconductor substrate, but that the semiconductor substrate is not limited to this example.

Moreover, in the present embodiment, the gate wiring layer 19 and the wiring layer 20 are formed of a material having a refractive index different from that of the interlayer insulating film 35. However, material for the gate wiring layer 19 and the wiring layer 20 is not limited to this. For example, effects similar to those described in the present embodiment can also be obtained by forming the gate wiring layer 19 and the wiring layer 20 of metal and causing the specular reflection of light incident on the gate wiring layer 19 and the wiring layer 20.

Moreover, in the present embodiment, the wiring layers 20 and 42 are provided as the gate wiring layers of MOS transistors which do not substantially function. However, the wiring layers 20 and 42 do not need to be wiring layers which do not substantially function as the gate wiring layers of MOS transistors as described above. Effects similar to those of the present embodiment can also be obtained by providing the gate wiring layer of the amplifier transistor 3, the reset transistor 5, or the like at a position facing the gate wiring layer of the readout transistor 2 across the photodiode, to be adjacent to the photodiode.

Furthermore, in the present embodiment, the wiring layers 20 and 42 are connected to the reset line 10. However, the wiring layers 20 and 42 may be connected to the readout line 6 or the horizontal address line 9. Furthermore the wiring layers 20 and 42 may be set to an electric potential equal to that of a power source or the semiconductor substrate.

However, the wiring layers 20 and 42 are preferably connected to the reset line 10 for the following reason. In the case where the wiring layers 20 and 42 are connected to the readout line 6, a high-level signal is also applied to electrodes (wiring layers 20 and 42) on the opposite side to the readout gates (gate wiring layers 19 and 41) when signals are read from the photodiodes 17 and 40. Thus, readout from the photodiodes 17 and 40 is deteriorated, and lag characteristics may become worse. Further, in the case where the wiring layers 20 and 42 are connected to the horizontal address line 9, the wiring layers 20 and 42 go to a high level and are prone to become unstable when signals are read out of a source follower circuit. In order to reduce noise occurring in the pixel, unstable signals should be reduced as much as possible. On the other hand, the reset line 10 is in a ground state and stable in terms of voltage. Accordingly, in the case where the wiring layers 20 and 42 are connected to the reset line 10, a high-level signal is not applied to the wiring layers 20 and 42 when signals are read.

(Application Example)

Figure 8:
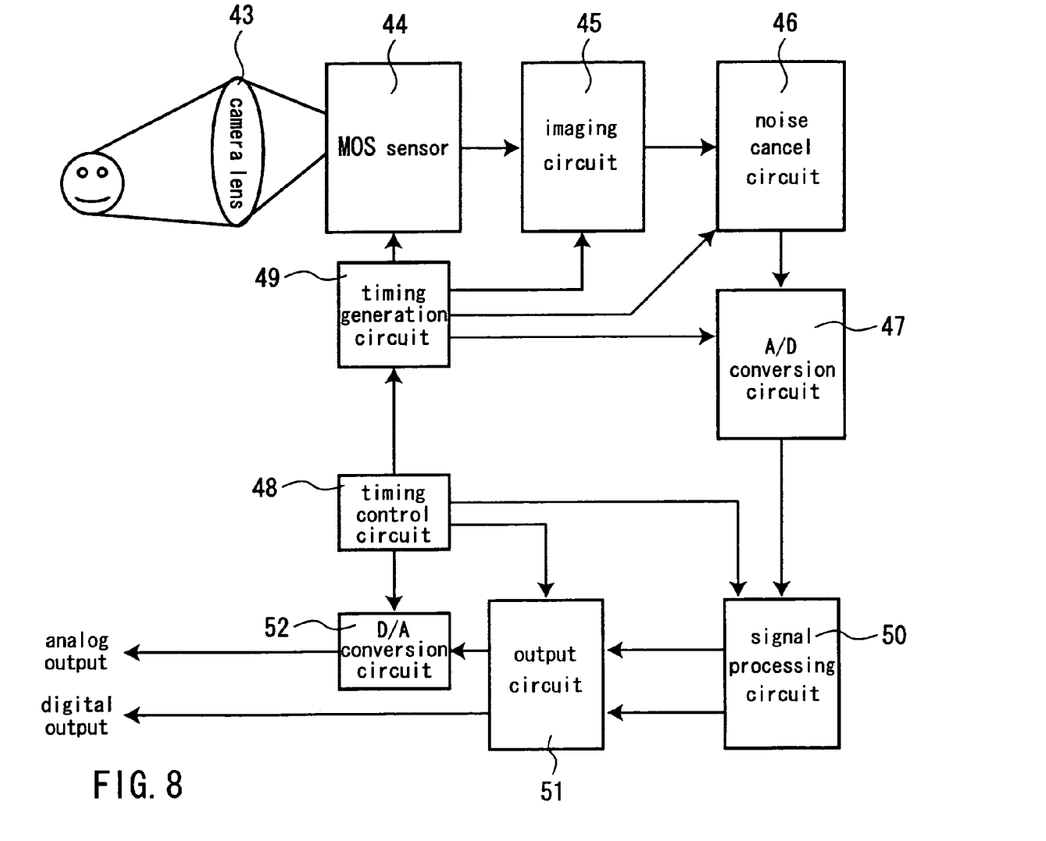
FIG. 8 is a block diagram showing the configuration of the electronic still camera to which the solid-state imaging device according to the present embodiment is applied.

In the solid-state imaging device according to the present embodiment, various application examples can be realized. As one application example, an electronic still camera to which the solid-state imaging device according to the present embodiment is applied will be described with reference to FIG. 8. FIG. 8 is a block diagram showing the configuration of the electronic still camera to which the solid-state imaging device according to the present embodiment is applied.

A camera lens 43 is an optical system for capturing a subject image. This optical system receives an optical image from a subject and leads the optical image to a predetermined position. A MOS sensor 44 is a solid-state imaging device for converting the optical image formed by the camera lens 43 into an electric signal corresponding to the light quantity of the optical image for each pixel. The solid-state imaging device according to the present embodiment can be applied to the MOS sensor 44. An imaging circuit 45 converts the electric signal obtained by the MOS sensor 44 into an analog voltage signal for each pixel. The analog voltage signal resulting from the conversion by the imaging circuit 45 is inputted into a noise cancel circuit 46. The noise cancel circuit 46 is a circuit for canceling variations in output characteristics of the imaging circuit 45. Output signals of the noise cancel circuit 46 are inputted into an A/D conversion circuit 47 through an AGC circuit (not shown) for adjusting the gains of voltage signals and a clamp circuit (not shown) for clamping the voltage signals in which levels are aligned. The A/D conversion circuit 47, for example, converts the analog voltage signals after clamping into digital data in which each piece of sampled data involves 10 bits, and outputs the digital data.

A timing control circuit 48 generates a timing pulse (system clock signal) for providing timing as the basis of operation of the system. A timing generation circuit 49 drives and controls the MOS sensor 44, the imaging circuit 45, the noise cancel circuit 46, and the A/D conversion circuit 47 in synchronization with the timing pulse generated by the timing control circuit 48. A signal processing circuit 50 is equipped with a shading compensation circuit. The shading compensation circuit performs shading compensation on the digital data inputted from the A/D conversion circuit 47. Further, the signal processing circuit 50 is provided with, for example, a color separation circuit, a gamma compensation circuit, a white clip circuit, a black clip circuit, a knee circuit, and the like in addition to the shading compensation circuit, and performs signal processing according to the needs on the inputted digital data. Moreover, the signal processing circuit 50 performs processing for color balance or the like as needed. An output circuit 51 outputs the digital data on which signal processing has been performed by the signal processing circuit 50. A D/A conversion circuit 52 converts the digital data inputted from the output circuit 51 into an analog signal.

Subsequently, the shading compensation performed by the shading compensation circuit will be described. The shading compensation is a process for converting a signal waveform in which the signal strengths of pixels located at edges of a captured image are reduced because the sensitivities of the unit cells of the MOS sensor 44 depend on the positions of the unit cells in the image area, into a signal waveform in the case where the sensitivities of the unit cells are equalized. In the shading compensation, calculation is performed on the assumption that a signal waveform obtained from the MOS sensor 44 is parabolic. That is, the signal waveform f (X) is assumed to be a parabola represented by the following equation:

$$f(X)=f(X)+\alpha?f(X_0)?(X-X_0)^2$$

where $X_0$ is the position of the pixel having the highest signal strength and $\alpha$ is a coefficient representing characteristics of the parabola.

Figure 9:
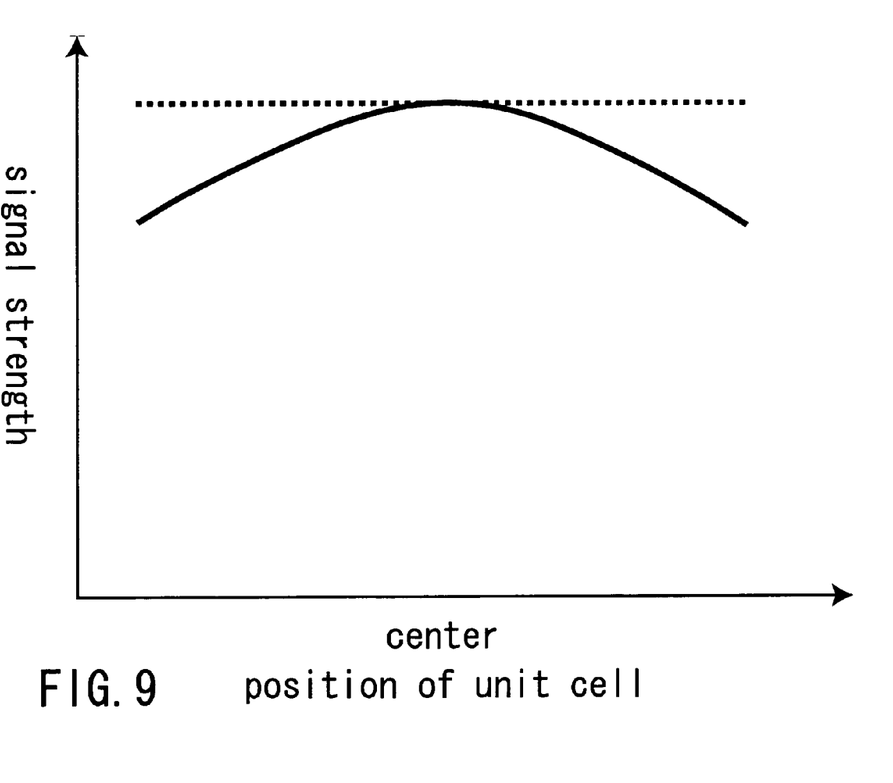
FIG. 9 is an illustration showing a signal waveform after the shading compensation in the electronic still camera according to the present embodiment.

A signal waveform after the shading compensation in the electronic still camera, to which the solid-state imaging device according to the embodiment of the present invention is applied, is shown in FIG. 9. Here, the case where the shading compensation is performed in the horizontal direction of a captured image will be described as an example. The horizontal axis represents the positions of pixels adjacently aligned in the horizontal direction of the captured image, and the vertical axis represents the signal strengths of the pixels. Further, a signal waveform before the shading compensation is represented by a solid linei and the signal waveform after the shading compensation is represented by a dotted line.

As described above, in the solid-state imaging device according to the embodiment of the present invention, unit cells symmetrically located with respect to the optical axis of the camera lens 37 have approximately the same sensitivities. Accordingly, a signal waveform obtained by the solid-state imaging device according to the present embodiment has a parabolic shape with a vertex at the pixel located at the center of a captured image. Consequently, shading compensation can be effectively performed by assuming that a signal waveform is parabolic, and the signal strength of a pixel can be made constant over the entire captured image as shown in FIG. 9.

As described above, if the solid-state imaging device according to the embodiment of the present invention is applied to an electronic still camera, shading compensation can be effectively performed, and the problem that a subject shown in an edge of a captured image dims can be prevented.

Incidentally, in the above-described application example, the case where shading compensation is performed in the horizontal direction of a captured image has been described as an example. However, the direction in which the shading compensation is performed is not limited to the horizontal direction. For example, the shading compensation may be performed in the vertical direction of a captured image.

The present invention can be variously modified within the scope thereof in a practical phase.

What is claimed is:

1. A solid-state imaging device comprising:
   a semiconductor substrate of a first conductivity type;
   a photodiode provided in the semiconductor substrate;
   a diffusion layer of a second conductivity type provided in the semiconductor substrate, the diffusion layer being spaced away from the photodiode;
   a gate wiring layer provided on the semiconductor substrate between the photodiode and the diffusion layer;
   a gate insulating film interposed between the semiconductor substrate and the gate wiring layer;
   a first wiring layer provided on the semiconductor substrate at a position which faces the gate wiring layer across the photodiode in a first direction, the first wiring layer being adjacent to the photodiode;
   an interlayer insulating film provided over the semiconductor substrate, the gate wiring layer, and the first wiring layer;
   a microlens provided on the interlayer insulating film at a position which faces the photodiode across the interlayer insulating film; and
   a second wiring layer electrically connected to the diffusion layer, the second wiring layer provided over the semiconductor substrate and the gate wiring layer, wherein
   a distance from an optical axis of the microlens to a side surface of the gate wiring layer is smaller than a distance from the optical axis of the microlens to a side surface of the second wiring layer in a second direction perpendicular to the first direction.

2. The solid-state imaging device according to claim 1, wherein the distance from the optical axis of the microlens to the side surface of the gate wiring layer adjacent to the photodiode is equal to a distance from the optical axis of the microlens to a side surface of the first wiring layer adjacent to the photodiode at positions which faces each other across the photodiode and which are at the same height from top surface of the semiconductor substrate.

3. The solid-state imaging device according to claim 1, wherein the gate wiring layer is formed of same material as the first wiring layer.

4. The solid-state imaging device according to claim 1, wherein the gate wiring layer has a film thickness equal to that of the first wiring layer.

5. The solid-state imaging device according to claim 1, wherein the first wiring layer is connected to a reset line.

6. An electronic still camera, comprising:
   an optical system configured to receive an optical image from a subject and lead the optical image to a predetermined position;
   the solid-state imaging device according to claim 1, the solid state imaging device configured to convert the optical image into an electric signal corresponding to the light quantity of the optical image for each pixel; and
   a shading compensation circuit configured to perform shading compensation on the electric signal.

* * * * *